(12) United States Patent
Hogan et al.

(10) Patent No.: US 9,231,543 B2
(45) Date of Patent: Jan. 5, 2016

(54) AUDIO POWER AMPLIFICATION WITH REDUCED INPUT POWER SUPPLY CREST FACTOR

(71) Applicant: Apple Inc., Cupertino, CA (US)

(72) Inventors: Roderick Hogan, San Francisco, CA (US); Joseph J. Curcio, San Jose, CA (US); Nathan A. Johanningsmeier, San Jose, CA (US); Casey L. Hardy, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 207 days.

(21) Appl. No.: 14/153,984

(22) Filed: Jan. 13, 2014

(65) Prior Publication Data

US 2015/0200640 A1    Jul. 16, 2015

(51) Int. Cl.
*H03F 99/00* (2009.01)
*H03G 3/00* (2006.01)
*H03G 3/20* (2006.01)

(52) U.S. Cl.
CPC . *H03G 3/004* (2013.01); *H03G 3/20* (2013.01)

(58) Field of Classification Search
CPC ................................. H03G 3/004; H03G 3/20
USPC ............ 381/28, 104, 107, 108, 120; 330/127, 330/251, 297, 199
See application file for complete search history.

(56) References Cited

U.S. PATENT DOCUMENTS

| | | | |
|---|---|---|---|
| 4,678,984 A | 7/1987 | Henze | |
| 7,656,061 B2 | 2/2010 | Litovsky | |
| 8,305,059 B2 | 11/2012 | Al-Shyoukh | |
| 2008/0144862 A1 | 6/2008 | Xu | |
| 2008/0279399 A1* | 11/2008 | Noro | H02M 3/156 381/120 |
| 2008/0303677 A1 | 12/2008 | Hart et al. | |
| 2009/0016549 A1* | 1/2009 | French | G06F 1/266 381/120 |
| 2009/0110214 A1* | 4/2009 | Litovsky | H02J 7/0004 381/106 |
| 2012/0223980 A1* | 9/2012 | Hollevoet | H02M 3/156 345/690 |

FOREIGN PATENT DOCUMENTS

GB    2480850 A    12/2011

OTHER PUBLICATIONS

Texas Instruments, Guidelines for Measuring Audio Power Amplifier Performance, Application Report, SLOA068—Oct. 2001, Audio Power Amplifiers, (pp. 1-29).
Fairchild Semiconductor, FAB3103—2.3 Watt Class-D Audio Amplifier with Integrated Boost Regulator and Automatic Gain Control, Jul. 2012, Fairchild Semiconductor, Rev. 1.0.2, (13 pages).

(Continued)

*Primary Examiner* — Paul S Kim
*Assistant Examiner* — Katherine Faley
(74) *Attorney, Agent, or Firm* — Blakely, Sokoloff, Taylor & Zafman LLP

(57) ABSTRACT

A power converter has an output that is coupled in parallel with an energy reservoir circuit and a power supply node of an audio power amplifier. The converter can set an upper limit on its input supply current that is variable in accordance with a control input. A controller is to produce a signal, coupled to the control input of the power converter, that is responsive to a measure of input supply voltage of the power converter and either output voltage of the power converter or output power of the amplifier. Other embodiments are also described and claimed.

26 Claims, 3 Drawing Sheets

(56) References Cited

OTHER PUBLICATIONS

"Boosted 2.2W Class D Amplifier with Automatic Level Control", MAXIM, MAX98500, product descripton, Maxim Integrated Products, 19-5189; Rev. 0; May 2010, (15 pages).

"High-Efficiency Class D Audio Amplifiers Extend Battery Life in Portable Applications", maxim integrated™, Tutorial 1760, Sep. 20, 2010, (11 pages).

Gaalaas, Eric, "Class D Audio Amplifiers: What, Why, and How", Analog Dialogue 40-06, Jun. 2006, Internet at: http://www.analog.com/analogdialogue, (7 pages).

Honda, Jun, et al., "Application Note AN-1071", Class D Audio Amplifier Basics, International Rectifier, Feb. 8, 2005, (14 pages).

Shin, Donghwa, et al., "Constant-Current Regulator-Based Battery-Supercapacitor Hybrid Architecture for High-Rate Pulsed Load Applications", Journal of Power Sources 205 (2012), doi: 10.1016/j.jpowsour.2011.12.043, (pp. 516-524).

* cited by examiner

AUDIO POWER AMPLIFICATION WITH REDUCED INPUT POWER SUPPLY CREST FACTOR

An embodiment of the invention relates to audio power amplifier systems, and in particular battery powered audio amplifier systems. Other embodiments are also described.

BACKGROUND

Audio content tends to have a high peak to average ratio, also referred to here as crest factor or peak to average power ratio, by virtue of the nature of speech, music and movies that are intended for humans. While a dc signal has the smallest possible crest factor of 0 dB, and that of a pure or single-tone sinusoid is 3 dB, acoustic engineers who strive to produce audio systems that have improved sound fidelity may prefer relatively high crest factors in the range of 25-40 dB for example, depending upon the particular audio content being reproduced. While the audio signal peaks in such cases are relatively high, that is relative to the average of the audio signal, the peaks typically do not last very long and as such can be amplified without too much distortion by a well-designed audio power amplifier. In certain consumer electronic products, Class D power amplifiers are used because of their relatively high efficiency vs. other amplifier topologies such as linear amplifiers. Class D amplifiers are popular in portable, battery powered consumer electronic devices such as smartphones, tablet computers and notebook computers. In such audio power amplification systems, a rechargeable battery of the portable device is coupled to provide the input supply power of a voltage boost converter whose output supplies power to the audio amplifier. The converter boosts the battery voltage, so as to obtain louder sound from a speaker that is being driven by the amplifier. The voltage boost converter typically has an output boost capacitor, which acts as a filter for the regulated dc output voltage of the boost converter. The amplifier may be a Class D audio amplifier, for example, a differential h-bridge driver. The audio signal is fed to a signal input of the Class D amplifier, and the latter drives the loudspeaker with a predetermined gain. Variable volume is achieved by applying a variable full band gain to the audio signal. Typically, the voltage boost converter provides a regulated dc output voltage that remains fixed despite variations in the battery voltage and variations in the load (being the power amplifier).

SUMMARY

A problem that may occur with the conventional audio power amplification system described above is that when the battery capacity drops, the battery output voltage also drops. When that happens, the voltage boost converter will demand more current from the battery in order to maintain the regulated output voltage. As such, there is a concern that under such a battery state, when audio content such as movies or music are being played back at a high volume setting, the battery must supply the peak currents demanded by the audio amplifier, even though the power amplifier is a very efficient Class D amplifier. More generally, even at lower volume settings, the crest factor at the power supply input to the power converter is sufficiently large such that very high (albeit relatively short duration) peaks occur in the battery current. As the battery capacity continues to drop in such a situation, the high crest factor of the audio signal will cause significant battery voltage droops. The problem is more severe when there are additional components in the portable device that might be demanding more current at the same time as the audio playback, e.g. a graphics processor, a cellular network communications interface. The battery voltage in such a case could drop too low for some of the other power supply circuits in the portable device thereby causing a power manager circuit to signal a system reset for example. Protection schemes may be provided that will prevent such a drastic event as a system reset, by temporarily reducing the volume for example. While such situations may be unlikely, because in most instances the total current draw upon the battery is well within the capabilities of the battery (even at a lower capacity), it would be desirable to have a deterministic or systematic approach that limits peak power draws upon the battery during a wide range of audio content playback, without having to make drastic volume adjustments that could be noticeable to the user.

An embodiment of the invention is a method for audio amplification in which an audio signal is amplified using a power amplifier, where a power supply node of the amplifier is to receive power from a power converter in parallel with an energy reservoir circuit (e.g., a filter capacitor). The power converter automatically adjusts or controls its input supply power, based on a measure of output power of the power amplifier (while the audio signal is being amplified). In one aspect, a result of this automatic control or adjustment is that when the instantaneous output power of the amplifier is higher than the input supply power to the power converter, the energy reservoir is being emptied. Also, when the instantaneous output power is lower than the input supply power to the power converter, the energy reservoir is being replenished (by the power converter). Operating the power converter in this manner will result in the energy level in the reservoir rising or falling, depending on whether the instantaneous output power of the amplifier is lower or higher than the input supply power to the power converter. An observation from simulation results is that the crest factor at the input power supply to the power converter (during audio playback) is advantageously reduced.

The above control scheme results in the output voltage of the power converter varying significantly, i.e. it is not going to remain fixed at a regulated dc level. For example, the output voltage may vary by more than 20% while supplying power to the audio amplifier, and in some cases more than 30%, depending upon the capacity of the energy reservoir (e.g., the capacitance of the filter capacitor) and upon the sound volume setting.

In one embodiment, the power converter is a voltage boost converter, and the energy reservoir circuit is the output filter capacitor of the boost converter. This embodiment may be used in portable consumer electronic devices that are battery powered, such that the input supply power to the power converter is from a battery. In contrast to conventional cases in which the energy reservoir of a voltage boost converter is maintained near constant, when the audio amplifier is outputting significant power, an embodiment of the invention will exhibit significant variation in the output voltage of the power converter. In one aspect, the output voltage will start to fall or sag as soon as the sound volume setting for the audio signal has been increased, from, for example, 0% to 25%. The energy reservoir circuit will thus exhibit voltage headroom during audio playback, which allows a reduction in the crest factor of the input supply power to the power converter. The headroom in the energy reservoir circuit in some cases may allow the crest factor at the input of the power converter to be very small, e.g. essentially zero dB for audio content that lies in the middle and high frequency ranges. For audio content in the low frequency ranges, such as below 150 Hz, the crest factor may be greater than 0 dB but smaller than the conventional approach, due to the reduction in the peak input currents which in turn is due to the ability of the energy reservoir circuit to in effect supply the peak current demands of the power amplifier. Another way to view an embodiment of the invention is that peak current draws by the power amplifier are supplied for the most part by the energy reservoir circuit, while the average current level needed by the power amplifier is provided by the battery (through the power converter).

The control mechanism that is needed to in effect "regulate" the power converter's input supply power (or, analogously, the input supply current) so as to meet the demands of the power amplifier may be a feed-forward mechanism, a feedback mechanism, or a hybrid approach. For instance, as an alternative to determining a measure of the output power of the amplifier, the output voltage of the power converter can be used by itself to control the input supply power to the power converter. Also, while an embodiment of the invention is particularly suitable for reducing crest factor at the supply input of a voltage boost converter, in combination with a class D audio amplifier, other types of audio power amplifiers and power converters can be used. These include analog amplifiers and step down power converters.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. While numerous details are set forth, it is understood that some embodiments of the invention may be practiced without these details. In other instances, well-known circuits, structures, and techniques have not been shown in detail so as not to obscure the understanding of this description.

Figure 1:
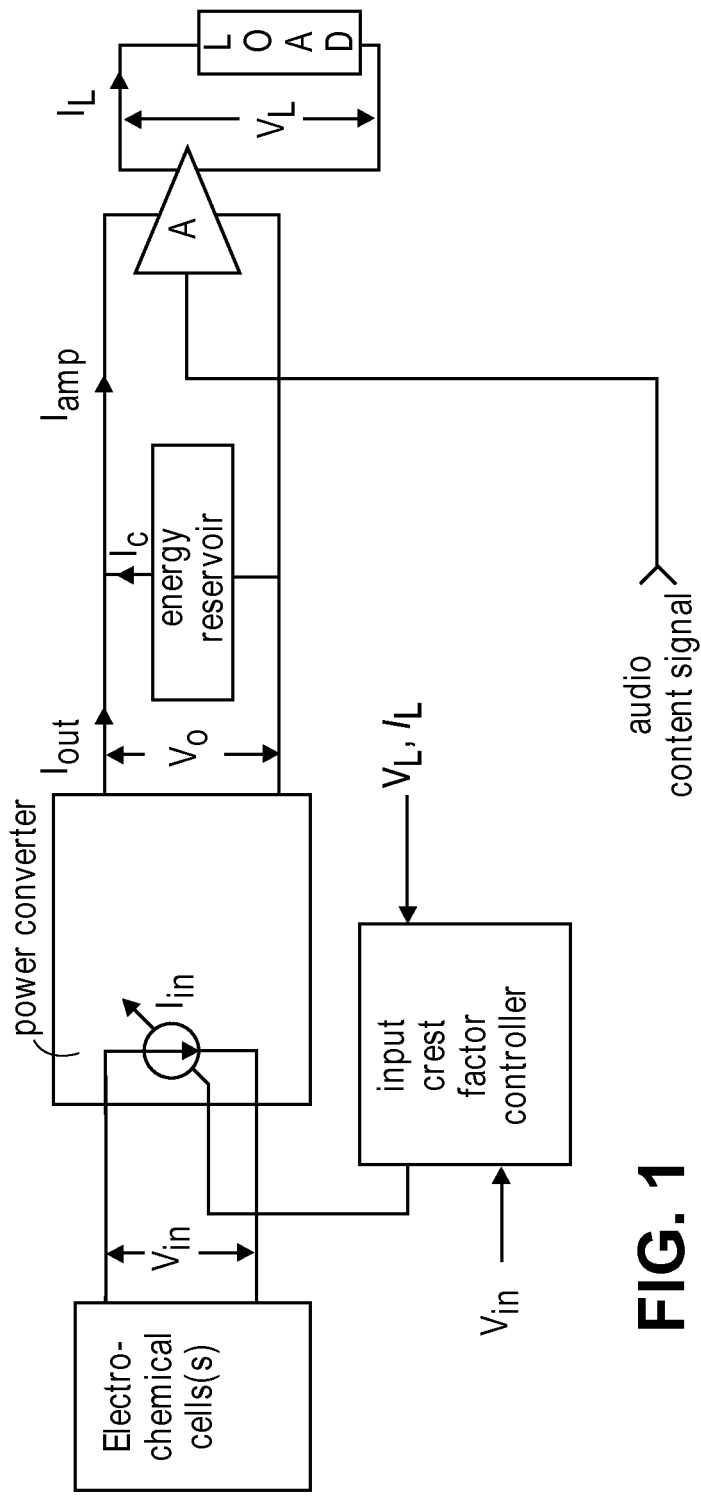
FIG. 1 depicts a circuit schematic of an audio amplification system having a power converter input crest factor controller.

FIG. 1 depicts a circuit schematic of an audio amplification system having a power converter input crest factor controller. FIG. 1 depicts various electronic hardware components of the system. For conciseness, this figure is also used to illustrate a method for audio amplification having broader process operations or actions. In the example depicted in FIG. 1, input supply voltage is provided by one or more electrochemical cells, e.g. a rechargeable lithium ion battery or other limited energy source. The system amplifies an audio content signal using a power amplifier A whose power supply node is coupled to receive power from a power converter, in parallel with an energy reservoir circuit. In this case, the power converter output current can be viewed as being summed with the current from the energy reservoir $I_c$ to yield the amplifier input supply current $I_{amp}$. The output of the power amplifier A drives a load by producing a load current $I_L$ and load voltage $V_L$, for example across a loudspeaker. In one embodiment, the power amplifier A provides a predetermined gain to its input audio content signal, and the volume or loudness of the sound produced by the loudspeaker load is determined by applying a variable gain to the audio content signal prior to input to the power amplifier.

The power converter automatically adjusts or controls its input supply power Pin=Vin*Iin, based on a measure of output power of the power amplifier (while the audio signal is being amplified). In most instances, this control of the input supply power can be most efficiently achieved by controlling a limit on input supply current, as shown. A controller (also referred to as an input crest factor controller) will determine in real-time a measure of the output power of the amplifier, while the audio content signal is being amplified, and will produce a control signal that is coupled to a control input of the power converter. The control input of the power converter can be viewed as "turning a knob" that performs variable duty-cycle control of switch mode power supply circuitry within the power converter, to limit the input supply current that is drawn by the power converter. The signal applied to the control input of the power converter may be viewed as representing a limit on the input supply power, and is responsive to not only a measure of the output power of the amplifier but also to the input supply voltage $V_{in}$ of the power converter. In one embodiment, the measure of the output power of the amplifier is obtained by directly sensing the load voltage $V_L$ and the load current $I_L$. Alternatives to such a measure of the output power are given below.

The automatic adjustment of input supply power to the power converter is performed by the controller, in such a way that when the instantaneous output power of the amplifier is higher than the input supply power to the power converter, the energy reservoir circuit is being emptied. For example, when the instantaneous output power of the amplifier is greater than an average output power level of the amplifier, where this average level is to be provided by the electrochemical cell, the energy reservoir circuit will supply the additional needed power. When the instantaneous output power of the amplifier is lower than the input power to the power converter, or lower than an average amplifier output power level, the energy reservoir is being replenished (by power from the power converter). The emptying and replenishment of the energy reservoir circuit may be viewed as discharging and charging a filter capacitor, where the energy reservoir circuit in that case may be simply the filter capacitor. The emptying of the energy reservoir circuit is evidenced by, in the case of the filter capacitor, a falling voltage across the capacitor, whereas when the energy reservoir is being replenished the voltage across the capacitor will be rising.

The automatic adjustment of the input supply power to the power converter is to be performed so as to reduce peak current demand upon the electrochemical cell. This helps with certain consumer electronic products that have relatively power hungry central processing units or graphics processing units that share the energy of the electrochemical cells with the audio power amplification system. Where the peak power draws in such a product align in time to produce very high peak currents (or large crest factors), the problem of battery voltage droop is more likely to occur. As such, input supply crest factor reduction is particularly desirable in those instances.

Figure 2:
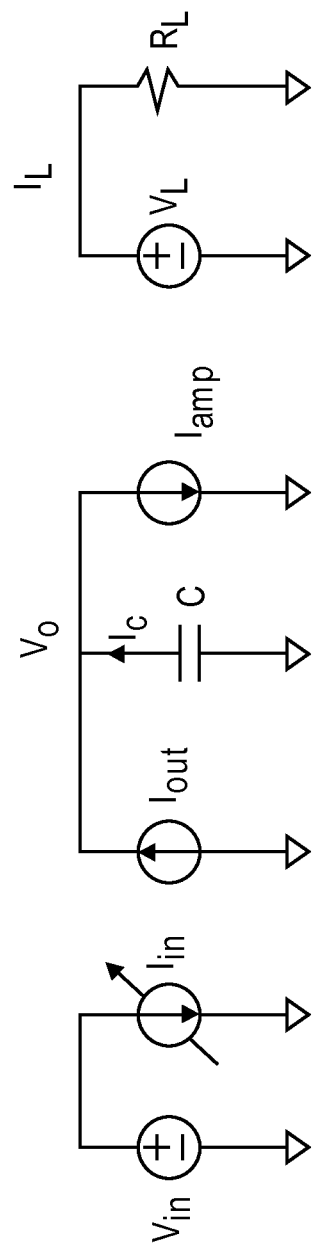
FIG. 2 is a circuit schematic of a partial simulation model for the amplification system of FIG. 1.

FIG. 2 illustrates a simulation model of an audio power amplification system, which can be used to verify the reduction in crest factor at the power supply input of a power converter. Note, however, that this simulation model is only an estimate and does not, for example, provide for "overhead" power consumption by the power converter and the audio amplifier, referenced below as $P_{overhead\_PC}$ and $P_{overhead\_amp}$.

The input power to the power converter may be given by $$V_{in} * I_{in} = V_o * I_{out} + P_{overhead\_PC}$$

In addition, $V_o * I_{out} = P_{L(average)} + P_{overhead\_amp} + P_{fill\_energy\_reservoir}$. In other words, the output power of the power converter can be viewed as about equal to an average power amplifier output level, plus overhead power associated with the power amplifier, plus some power needed to fill the energy reservoir. The instantaneous power amplifier output that exceeds the average level is to be supplied by the energy reservoir circuit. Here, it should also be noted that $$I_{amp} = \frac{V_{L(instantaneous)}}{R_L} + I_{overhead\_amp}$$

An expression for the average amplifier output power may be given by $$P_{L(average)} = I_{L(average)}^2 * R_L = \frac{V_{L(average)}^2}{R_L}$$

Based on the above expressions, an approximate equation for $I_{in}$ can be written as follows $$I_{in} \approx \frac{P_{L(average)} + P_{overhead\_amp} + P_{fill\_energy\_reservoir} + P_{overhead\_PC}}{V_{in}}$$

The above expression can be used by the crest factor controller to update the control signal at the $I_{in}$ control input of the power converter. Note that in the expression above for $I_{in}$, the terms $P_{overhead\_amplifier}$, $P_{fill\_energy\_reservoir}$, and $P_{overhead\_PC}$ can be predetermined based on laboratory or experimental testing of, for example, several production specimens of the power amplification system. It should be noted that $P_{fill\_energy\_reservoir}$ may depend on the size of the energy reservoir circuit, e.g. the capacitance of the filter circuit. It may be expected that for a larger capacitor, a greater amount of power should be allocated to quickly replenish or fill the energy reservoir. The remaining two terms in the expression above for $I_{in}$ are $P_{L(average)}$ which as suggested above may be sensed in real-time based on a direct sensing of the load voltage and load current at the output of the power amplifier, and $V_{in}$ which can be sensed at the input of the power converter. In one example, the power converter's supply input will be in parallel with the electrochemical cell as shown in FIG. 1. In that case, $V_{in}$ is the instantaneous battery voltage (which is readily available).

It can be seen that the expression above for $I_{in}$ can viewed as setting the input supply power to the power converter to be essentially equal to the average amplifier output power, plus a relatively small amount of overhead power and power needed to fill the energy reservoir. The assumption here is that any excess power demanded by the power amplifier (due to the content of the audio signal), that is in excess of $P_{L(average)}$, will be provided inherently by the energy reservoir circuit. In such a case, the current $I_e$ provided by the energy reservoir is proportional to the difference in power between a) the amplifier output power that exceeds its average during a peak excursion and b) the selected power for filling the reservoir $P_{fill\_energy\_reservoir}$ divided by the power converter output voltage $V_o$.

Figure 3:
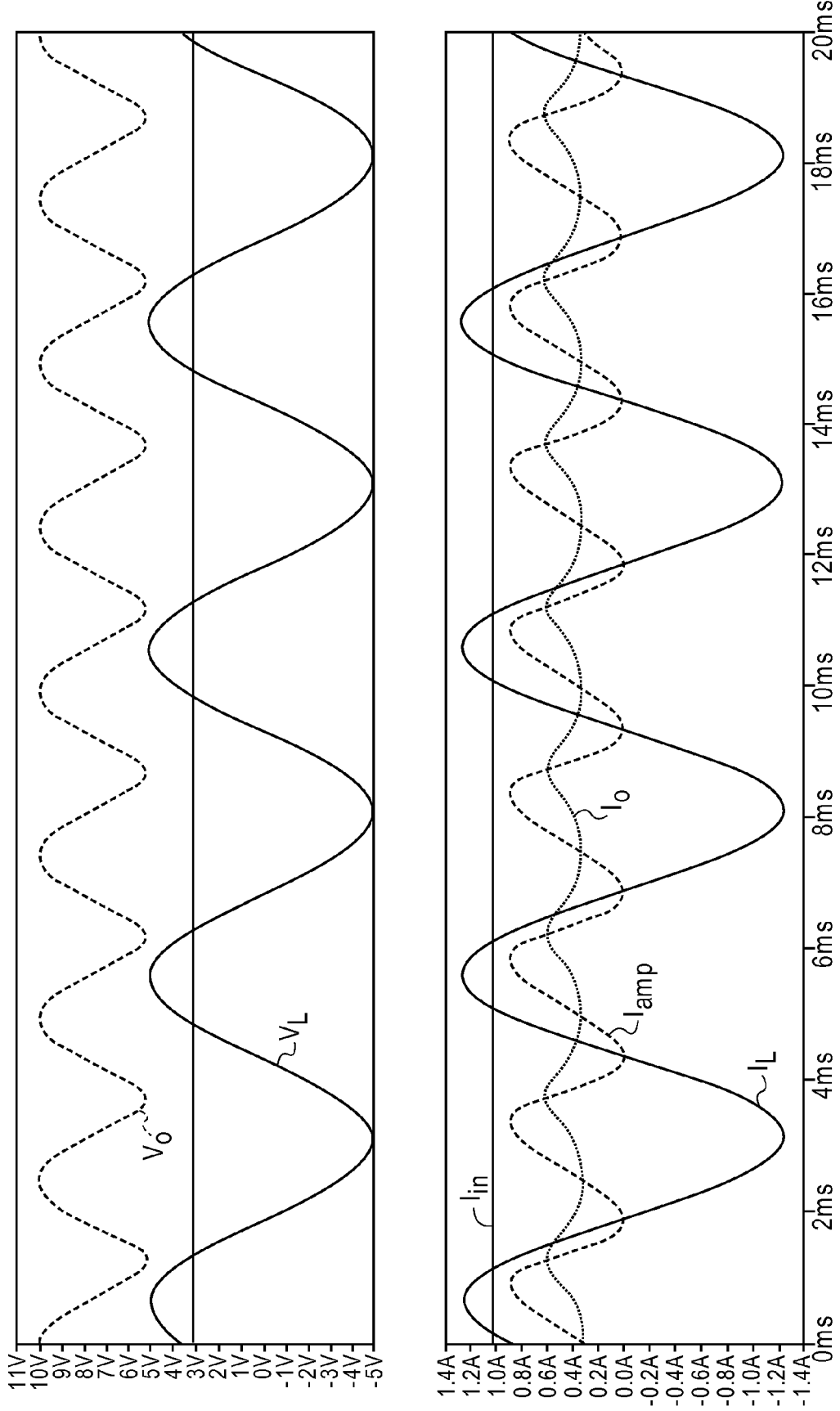
FIG. 3 shows voltage and current waveforms obtained using the simulation model of FIG. 2 for an example audio content signal being a pure sinusoid.

The above expressions can be used by electronic computer simulation software to compute voltage and current waveforms using the simulation model of FIG. 2. FIG. 3 shows the results of such a simulation in the particular example of the audio signal being a pure 200 Hz sinusoid. For this particular example, the electrochemical cell voltage $V_{in}$ was selected to be 3.1 volts while the load resistance $R_L$=4 ohms. The average output power at the output of the amplifier was set to be 3.125 watts. The energy reservoir circuit in this example consists of a capacitance of 68 microfarads. Of course, these numbers are merely used for the example simulation model here and should not be construed as limiting the scope of the audio power amplification system.

The simulation results in FIG. 3 show that, in contrast to a conventional voltage boost converter that provides a regulated dc output voltage, $V_o$ actually varies a significant amount, for example, by more than 20%, and in a further example as depicted in FIG. 3, by more than 30%. Note also that in this case the power converter provides a voltage boost from $V_{in}$=3.1 volts to a power converter output voltage $V_{out}$ of 5 volts peak-to-peak. The variation in the output voltage of the power converter can occur even during a reasonable sound volume setting for the audio signal, such as between 50% and 75%, and where the audio signal has spectral components below 150 Hz. Note, however, that while FIG. 3 shows this result occurring at 200 Hz, this result also occurs at lower frequencies e.g., 150 Hz and lower.

FIG. 3 also shows how the input supply current to the power converter, $I_{in}$, has essentially zero dB crest factor, that is essentially a dc current (at approximately 1 ampere, in this example). Note also that when the instantaneous load current $I_L$ is greater than the average of $I_{in}$, the difference $I_{amp} - I_o$ starts to increase above zero, and then drops back to zero when the instantaneous $I_L$ has also decreased back to the average level of $I_{in}$. This is the current that is supplied by the energy reservoir circuit. When $I_{amp} - I_o$ is negative, the reservoir is being replenished.

Another interesting characteristic of the audio power amplification system here is, still referring to FIG. 3, that the voltage of the power converter output $V_o$ varies between a minimum and a maximum as shown, while the amplifier output voltage $V_L$ remains at all times about equal to or smaller than the minimum power converter voltage $V_o$. This may take place at sound volume settings between 50% and 75%, for example when the audio signal is a pure 200 Hz tone, or even a pure 100 Hz tone. In the example here, the output voltage of the amplifier $V_L$ may be deemed to be that of a class D amplifier having a H-bridge driver circuit in which a 10 volt peak-to-peak audio signal is produced (for driving the load), using a 5 volt peak-to-peak voltage at the power converter output $V_o$. Other amplifier topologies are possible however, including a linear amplifier.

A further interesting characteristic is that the voltage of the power converter output $V_o$ varies between a) a maximum output voltage of the amplifier at a low end, and b) a voltage that is at least 20% greater, at a high end. This can be seen in the example of FIG. 3, where $V_o$ varies between about 5 volts at a low end (which is about the maximum load voltage $V_L$,) and about 10 volts at a high end (which is at least 20% greater than the maximum $V_L$, and more particularly at least 30% greater). This variation in the output voltage $V_o$ is actually desirable, because it results in the energy reservoir circuit primarily supplying the peak currents (demanded by the amplifier) while at the same time the electrochemical cell or battery is only allowed to supply not much more than the average current (demanded by the amplifier). This also enables a larger crest factor to be supported at the output of the amplifier, which is more desirable for audio applications. Indeed, loudspeakers routinely can handle or demand a peak input current that is 20-25 times larger than the average input current to the loudspeaker, in part due to the nature of, for example, an electrodynamic speaker that has a relatively small voice coil element that tends to heat up and cool down very rapidly, thereby supporting relatively high peak currents. In one embodiment, an increase in peak amplifier output power of approximately a factor of 4 may be achieved using the arrangement of the power amplification system described here, for the same average power supplied by a conventional, 8 volts regulated dc output boost converter.

It should be noted that the energy reservoir circuit (e.g., filter capacitor) cannot be so large that the voltage across it (here, the output voltage $V_o$ of the power converter) does not droop at all during a nominal loudness setting for audio playback (e.g., 50% of maximum volume). This variation of $V_o$ (also referred to here as voltage headroom) is needed also to achieve small physical size. With such an arrangement, the output voltage of the power converter $V_o$ will start to sag or fall as soon as any appreciable power is being requested by the amplifier, e.g. as soon as the sound volume setting for audio playback has been increased, for example, from 0% to 25%. This is in contrast to a conventional power converter whose output remains at a tightly regulated dc level.

A further observation as seen in the simulation results of FIG. 3 is that the single-ended output voltage of the amplifier $V_L$ (i.e., measured relative to, for example, a power return node of the power converter, e.g. ground, or the negative terminal of the battery which is supplying power to the power converter) will not reach, or go as high as, the maximum output voltage of the power converter $V_o$. This is a byproduct of the needed output voltage headroom that is provided by the power converter.

Figure 4:
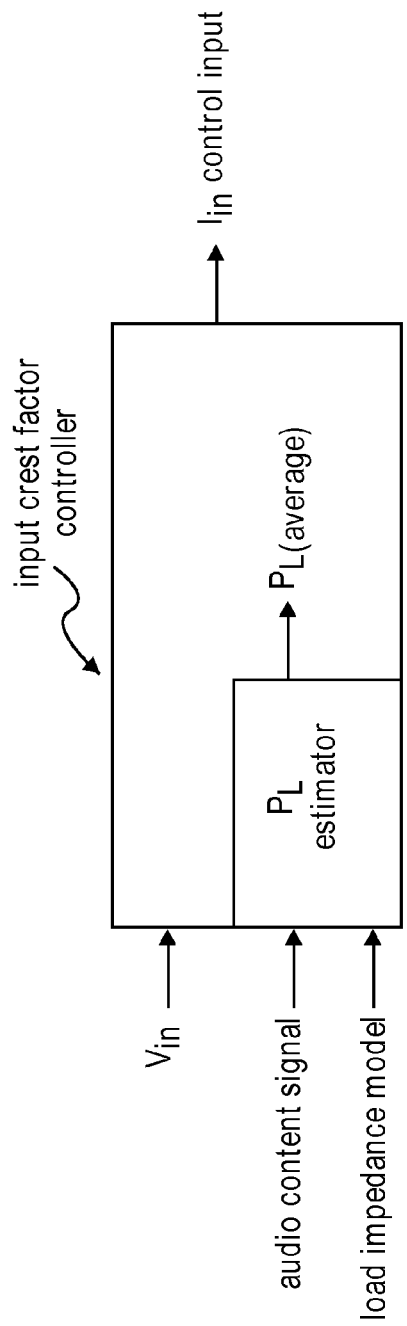
FIG. 4 is a block diagram of an embodiment of the crest factor controller that uses the audio content signal to perform a look-ahead process.

Turning now to FIG. 4, this is a block diagram of an embodiment of the invention in which the input crest factor controller can perform a look-ahead process, when determining a measure of the amplifier output power. Generally, the measure of amplifier output power can be a) sensed from load voltage and load current, b) computed or estimated based on just sensed amplifier output voltage (load voltage) or just sensed amplifier output current (load current) in combination with a model of the load impedance, or c) computed or estimated by a look-ahead process which uses the audio signal and estimates of the load impedance and the gain provided by the amplifier. The look-ahead process may be performed by a programmed processor, depicted in FIG. 4 as a $P_L$ estimator block which computes an average or other suitable measure of central tendency of strength of the audio content signal, such as $P_{L(average)}$. A portion of the audio signal, for example, a frame of a discrete time sequence that may be on the order of about 5 milliseconds to 10 milliseconds, for example, is analyzed (prior to that portion being amplified by the power amplifier). The adjustment made to the input supply power of the power converter that is performed automatically here is responsive to the look-ahead process, and in particular may be based on a computed moving measure of the central tendency of the strength of the audio signal (e.g., a moving average power over the given time window or frame).

The automatic adjustment of the input supply power may include raising a limit on the input supply current $I_{in}$ whenever the computed moving measure of central tendency of strength is rising. In other words, more power can be transferred into the power converter, thereby enabling the energy reservoir to be filled higher, when it is found that in an upcoming frame the output power will be rising.

Continuing with the look-ahead process, when the computed moving measure of central tendency of the strength of the audio signal is falling, this suggests that the amplifier will require less power, such that the input supply power to the power converter can be restricted, by lowering the limit on the input supply current.

The power tracking feature of the look-ahead process essentially lets the crest factor controller learn something about the future content of the audio signal that is driving the amplifier. The look-ahead process may be performed entirely in the digital domain, or it may be performed using an analog delay scheme which allows sufficient time for any computations or estimates to be made about the future power demand. The length of the window or frame during which the output power of the amplifier is estimated can be selected as a function of the ability of the energy reservoir or filter capacitor to support the peak power level that could be demanded by the power amplifier. For instance, if the energy reservoir can support a peak power level for about 5 ms, then the look-ahead process may have sufficient information about the amplifier's output power by processing a window of about 5 ms.

Still referring to the look-ahead process, when the audio signal content has one or more lower frequency components that are particularly low enough that, in combination with a sufficiently high volume setting, will significantly empty the energy reservoir, the crest factor controller should allow more power or current to be supplied from the battery (and into the power converter). In one embodiment, the look-ahead process includes determining whether the portion of the audio signal (e.g., a window or frame) contains a spectral or frequency component that is lower in frequency than a predetermined threshold and if so automatically adjusts the input supply power to the power converter by raising a limit on the input supply current. Now, especially in the context of a battery powered system, the limit on input supply current should be raised only if the input supply voltage to the power converter, in this example, the battery voltage, is sufficiently high. This process of changing the limit on the supply input current may result in the battery output current exhibiting some ripple, but the ripple is limited when the battery voltage has dropped too low. On the other hand, when the battery voltage is sufficiently high, the ripple on the battery current can be allowed to increase, by increasing the limit on the input supply current to the power converter.

Figure 5:
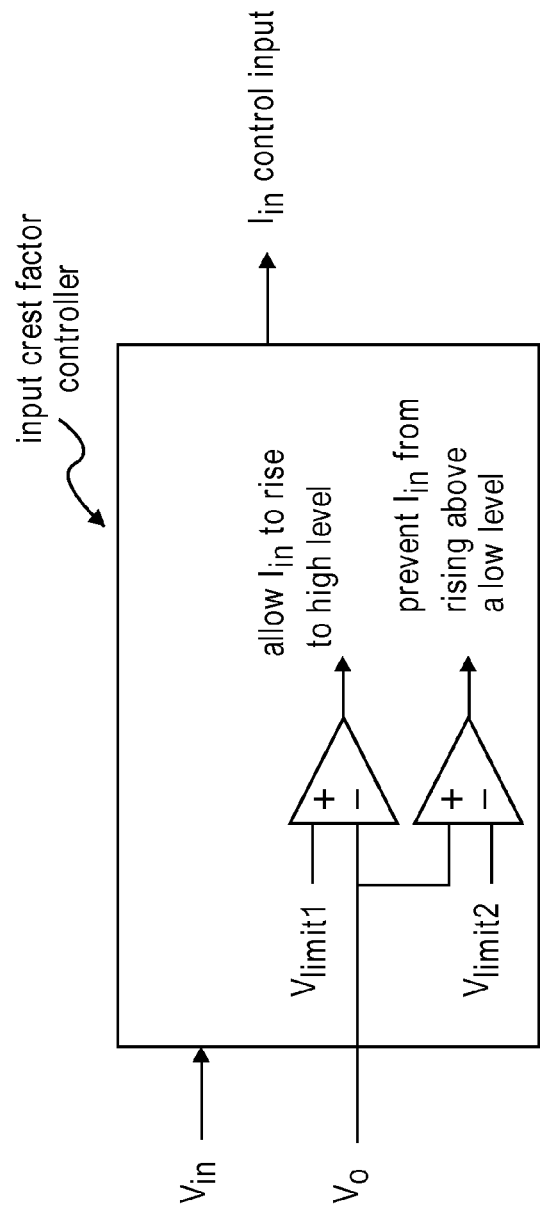
FIG. 5 is a block diagram of an embodiment of the input crest factor controller that relies upon the power converter output voltage.

In accordance with another embodiment of the invention, control of the input supply power to the power converter may proceed as follows. While amplifying the audio signal, the power converter automatically adjusts its input supply power based on sensing the voltage of the power converter output, $V_o$, without having to rely upon, for example, sensing the power amplifier output voltage or current, and without having to perform a look-ahead process to predict a measure of the amplifier output power. FIG. 5 illustrates a block diagram of such an embodiment. The input crest factor controller in this case produces a signal for the control input of the power converter that adjusts $I_{in}$, as a function of monitoring the power converter output voltage $V_o$. A result of such a process may be similar to what was described above in connection with FIG. 1, namely that when the instantaneous output power of the amplifier rises above the input supply power to the power converter, the power converter output voltage decreases (signifying the emptying of the energy reservoir). Also, when the instantaneous output power of the amplifier falls below the input supply power to the power converter, the power converter output voltage increases (signifying that the energy reservoir is being replenished). For instance, referring back to FIG. 3, when $V_L$ and $I_L$ are both increasing, for example, between the 5 ms and 6 ms markers, where in that case the input power is approximately fixed at 3.1 watts, $V_o$ is decreasing. The decrease in $V_o$ is significant, and in this example the decrease is from 10 volts down to less than 7 volts. At the other end of this cycle, when the instantaneous output power falls below 3.1 watts, namely between the 6 ms and 8 ms markers, the power converter output voltage $V_o$ increases significantly, and in this example from about 5 volts up to 10 volts.

In a similar embodiment, the input supply power to the power converter is automatically adjusted by allowing the input supply current of the power converter to increase, as needed by the power converter when supplying power to the power amplifier, up to a predetermined high level. This is in response to the power converter output voltage dropping below a certain limit. As depicted in FIG. 5, a voltage comparator circuit, in this case given by two comparators that may receive the same or different reference voltages $V_{limit1}$, $V_{limit2}$, is used to monitor $V_o$. The voltage comparator circuit asserts a signal that allows $I_{in}$ to rise to a high level, when $V_o$ is smaller than $V_{limit1}$. In other words, when the power converter output voltage is below $I_{in}$ is allowed to rise to some predetermined high level. At the other end of the cycle, when the power converter output voltage $V_o$ rises above $V_{limit2}$, $I_{in}$ is prevented from rising above a predetermined low level.

In one embodiment, the predetermined low level for the input supply current is essentially zero, while the predetermined high level for the input supply current is some maximum level that can be drawn from the battery (or other power supply feeding the power converter). This may be viewed as an on/off approach to regulating the input supply current. As an example, when $V_o$ is below a certain threshold (e.g., close to but below a maximum level, as represented by $V_{limit1}$), the input current is allowed to rise to its maximum level (where this maximum level is believed to be sufficient for normal loudness volume settings). In FIG. 3, the highest level for $V_o$ is approximately 10 volts. When $V_o$ then actually reaches the maximum level, as represented by $V_{limit2}$, the input supply current is cutoff completely.

In another embodiment, the predetermined high level for the input supply current is adjusted as a function of volume setting. For example, if the volume setting is high, then it is expected that more power will be needed, and as a result the input supply current will be allowed to rise to a higher level. In contrast, when the volume setting is low, the predetermined high level for the input supply current can be decreased.

In a further embodiment, the predetermined high level for the input supply current can be adjusted upwards, that is can be set to a higher level, in response to the input supply voltage of the power converter (e.g., the battery voltage) being higher. In other words, when the battery is in a greater state of charge, thereby exhibiting a higher voltage, the predetermined high level for the input supply current can be increased with less concern for voltage droops.

An audio device has been described that includes an audio power amplifier, and a power converter that can set an upper limit on its own input supply current which is variable in accordance with a control input (see FIG. 1). An input crest factor controller produces a signal which is coupled to the control input of the power converter and that is responsive to measures of a) output power of the amplifier and b) input supply voltage of the power converter. Several approaches for obtaining measures of the output power of the amplifier were described above, including a look-ahead process. The controller is designed to produce the signal, to control the power converter, such that when instantaneous output power of the amplifier is higher than its own average output power, the energy reservoir level goes down or the energy reservoir circuit is being emptied. But when the instantaneous output power of the amplifier is lower than its average output power, the energy reservoir is being replenished (or the energy level goes up.) The input supply power of the power converter may be provided by a rechargeable battery such as when the system depicted in FIG. 1 is integrated within a portable consumer electronics device, e.g. a laptop computer, a tablet computer, a smartphone, or a self-powered headset. In some cases, where the audio amplifier needs to provide greater power output, the power converter is a voltage boost converter that provides the amplifier with a higher supply voltage, thereby enabling greater output power to be delivered to the speakers. For improved efficiency, the audio amplifier may be a class D amplifier.

Another way to view an embodiment of the invention is a power converter whose output voltage is now primarily current controlled, rather than constant voltage output regulated, so as to reduce sharp increases in the input supply current. In the case where a battery is supplying the input power to the power converter, the techniques described here may help regulate, in a sense, the output power of the battery so that the battery provides in one embodiment essentially the average level of power demanded by the audio amplifier, while peak excursions (above the average) are supplied primarily by the energy reservoir circuit at the output of the power converter.

In one embodiment, the controller controls the input supply power to the power converter responsive to a measure of the output power of the amplifier, where such a measure may be obtained via direct amplifier output voltage and/or current sensing, or via numerical estimation. The measure may be limited, to a "first order", to just a low frequency band. For example, it is expected that the demands on the energy reservoir are greatest in a low frequency band, for example below 400 Hz, and more specifically below 150 Hz. It is indeed the bass range that is most likely to deplete the energy reservoir (in a practical system.) In the look-ahead process, the average power is computed over a given moving interval and the input supply current is adjusted upwards as needed to allow the computed average amount of power to be drawn from the power supply (during the ensuing amplification of the audio signal in that interval.) The expectation here is that any excursion of instantaneous output power that is above the average power level will be "covered" by the energy reservoir circuit. In this manner, it is less likely that peak or transient currents are pulled from the battery (or other power supply to the power converter); rather, only the average level of amplifier output power is drawn from the battery.

It should also be noted that there is an initial condition in which the energy reservoir circuit starts as completely empty, and therefore should be fully replenished (or fully charged) before any significant audio output is allowed. However, in most cases, it is expected that this is not an onerous requirement since at the start of any audio playback, there is at least one hundred milliseconds (ms) of relatively low power audio output, which should be more than enough time to fully replenish the energy reservoir circuit. A more deterministic approach may be to limit the input supply current $I_{in}$ upon initialization or startup, which may last no more than a very short interval such as on the order of 100 ms, during which the output power of the amplifier is limited, by, for example, reducing the volume setting.

In another embodiment, the input crest factor controller produces a signal that is coupled to the control input of the power converter and that is responsive to measures of a) output voltage of the power converter and b) input supply voltage of the power converter. This is the embodiment described above in which, for example, the input supply current could be controlled in an on/off manner as a function of the power converter output voltage (without relying upon a measure of the amplifier output power.)

Two or more of the different control modes of operation of the input crest factor controller described above, for producing the control signal that is applied to limit the input supply power to the power converter, can be implemented in a single product. A further control process, referred to as a mode control process, running in the product, can automatically select one of the crest factor controller modes of operation, based on the type of audio application that is in the foreground, or based on the "audio context" that the product is in. For example, consider a product such as a smartphone in which any one of several distinct audio applications can be executed: a telephony application for voice or video calls, a media player which can play locally stored or remote network streamed audio or movie files, and a video game application. When listening to music or watching a movie using the player application, it may be expected that the user can tolerate more latency in the delivery of the audio content than during a phone call or during a fast action video game. Accordingly, the mode control process may select the look ahead process (for producing the power converter control signal) when the media player is running, but not during a more latency sensitive video game or phone call.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, although the crest factor reduction techniques described above may be especially advantageous in the context of battery powered systems, they can also be used in systems that use online power supplies. The description is thus to be regarded as illustrative instead of limiting.

What is claimed is:

1. A method for audio amplification, comprising:
amplifying an audio signal using a power amplifier whose power supply node is coupled to receive power from a power converter in parallel with an energy reservoir circuit; and
the power converter automatically adjusting its input supply power based on a measure of output power of the power amplifier while amplifying the audio signal, so that when instantaneous output power of the amplifier is higher than the input supply power to the power converter the energy reservoir circuit is being emptied, and when instantaneous output power of the amplifier is lower than the input supply power to the power converter the energy reservoir is being replenished by power from the power converter.

2. The method of claim 1 wherein voltage of the power converter output varies between a) maximum output voltage of the amplifier at a low end; and b) a high end that is at least 20% greater.

3. The method of claim 1 wherein adjusting the input supply power to the power converter causes voltage of the power converter output to vary by more than 20% while supplying power to the amplifier.

4. The method of claim 3 wherein the voltage of the power converter output varies by more than 30% while supplying power to the amplifier.

5. The method of claim 4 wherein a sound volume setting for the audio signal is between 50% and 75%, and the audio signal has spectral components below 150 Hz.

6. The method of claim 3 wherein a sound volume setting for the audio signal is between 50% and 75%, and the audio signal has spectral components below 150 Hz.

7. The method of claim 1 wherein voltage of the power converter output varies between a minimum and a maximum, and wherein output voltage of the amplifier remains smaller than the minimum power converter output voltage at sound volume settings between 50% and 75 while the audio signal is a 100 Hz tone.

8. The method of claim 1 wherein voltage of the power converter output starts to fall as soon as sound volume setting for the audio signal has been increased from 0% to 25%.

9. The method of claim 1 further comprising determining the measure of output power of the power amplifier.

10. The method of claim 9 wherein the determining the measure of output power comprises a look-ahead process in which a portion of the audio signal is analyzed prior to said portion being amplified by the power amplifier, wherein automatically adjusting the input supply power to the power converter is responsive to the look-ahead process.

11. The method of claim 10 wherein the look-ahead process comprises computing a moving measure of central tendency of strength of the audio signal, and wherein automatically adjusting the input supply power to the power converter comprises raising a limit on input supply current whenever the computed moving measure of central tendency of strength is rising.

12. The method of claim 11 wherein automatically adjusting the input supply power to the power converter comprises lowering the limit on the input supply current whenever the computed moving measure of central tendency of the strength is falling.

13. The method of claim 10 wherein the look-ahead process comprises determining whether said portion of the audio signal contains a spectral or frequency component that is lower in frequency than a pre-determined threshold, and wherein automatically adjusting the input supply power to the power converter comprises raising a limit on input supply current when the portion of the audio signal contains a spectral component that is lower in frequency than the pre-determined threshold.

14. The method of claim 13 wherein the limit on the input supply current is raised only if input supply voltage to the power converter is sufficiently high.

15. A method for audio amplification, comprising:
amplifying an audio signal using a power amplifier, while an output of a power converter is supplying power to an energy reservoir in parallel with a power supply node of the power amplifier; and
while amplifying the audio signal, the power converter automatically adjusting its input supply power based on voltage of the output of the power converter so that
when instantaneous output power of the amplifier rises above the input supply power to the power converter, the voltage of the output of the power converter decreases, and
when instantaneous output power of the amplifier falls below the input supply power to the power converter, the voltage of the output of the power converter increases.

16. The method of claim 15 wherein automatically adjusting the input supply power to the power converter comprises: allowing input supply current of the power converter to increase, as needed by the power converter when supplying power to the power amplifier, up to a pre-determined high level, in response to the voltage of the power converter output being below a limit; and
preventing the input supply current from increasing above a pre-determined low level, in response to the voltage of the power converter output being above the limit.

17. The method of claim 16 further comprising adjusting the pre-determined high level for the input supply current as a function of volume setting.

18. The method of claim 17 wherein the pre-determined low level for the input supply current is essentially zero, and the pre-determined high level for the input supply current is a maximum.

19. The method of claim 16 wherein automatically adjusting the input supply power to the power converter comprises comparing the voltage of the power converter output to a predetermined threshold, and wherein a) allowing the input supply current to increase and b) preventing the input supply current from increasing, are responsive to the comparing.

20. The method of claim 16 further comprising adjusting the pre-determined high level, for the input supply current, upward in response to input supply voltage of the power converter going upward.

21. An audio device comprising:
an audio power amplifier;
a power converter whose output is coupled in parallel with an energy reservoir circuit and a power supply node of the amplifier, wherein the power converter can set an upper limit on its input supply current that is variable in accordance with a control input; and
a controller to produce a signal, coupled to the control input of the power converter, that is responsive to measures of a) output power of the amplifier and b) input supply voltage of the power converter.

22. The audio device of claim 21 wherein the controller is to produce the signal to control the power converter such that when instantaneous output power of the amplifier is higher than its average output power, the energy reservoir circuit is being emptied, and when instantaneous output power of the amplifier is lower than its average output power, the energy reservoir is being replenished.

23. The audio device of claim 21 further comprising a battery that is coupled to provide the input supply power of the power converter.

24. An audio device comprising:
an audio power amplifier;
a power converter whose output is coupled in parallel with an energy reservoir circuit and a power supply node of the amplifier, wherein the power converter can set an upper limit on its input supply current that is variable in accordance with a control input; and
a controller to produce a signal, coupled to the control input of the power converter, that is responsive to measures of a) output voltage of the power converter and b) input supply voltage of the power converter.

25. The audio device of claim 24 wherein the controller is to produce the signal to control the power converter such that when instantaneous output power of the amplifier is higher than its average output power, the energy reservoir circuit is being emptied, and when instantaneous output power of the amplifier is lower than its average output power, the energy reservoir is being replenished.

26. The audio device of claim 24 further comprising a battery that is coupled to provide the input supply power of the power converter.

* * * * *